(12) United States Patent
Wang

(10) Patent No.: US 11,114,446 B2
(45) Date of Patent: Sep. 7, 2021

(54) SRAM WITH HIERARCHICAL BIT LINES IN MONOLITHIC 3D INTEGRATED CHIPS

(71) Applicant: INTEL CORPORATION, Santa Clara, CA (US)

(72) Inventor: Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/349,242

(22) PCT Filed: Dec. 29, 2016

(86) PCT No.: PCT/US2016/069188
§ 371 (c)(1),
(2) Date: May 10, 2019

(87) PCT Pub. No.: WO2018/125135
PCT Pub. Date: Jul. 5, 2018

(65) Prior Publication Data
US 2019/0273084 A1 Sep. 5, 2019

(51) Int. Cl.
*G11C 11/412* (2006.01)
*H01L 27/11* (2006.01)
(Continued)

(52) U.S. Cl.
CPC ........ *H01L 27/1104* (2013.01); *G11C 11/412* (2013.01); *G11C 11/417* (2013.01);
(Continued)

(58) Field of Classification Search
CPC ... G11C 11/419; G11C 11/417; G11C 11/412; G11C 2207/005; G11C 7/18;
(Continued)

(56) References Cited

U.S. PATENT DOCUMENTS 5,535,172 A * 7/1996 Reddy .............. G11C 7/18
365/189.02
5,917,745 A * 6/1999 Fujii .............. G11C 11/4097
365/63

(Continued)

OTHER PUBLICATIONS

PCT/US2016/069188, International Search Report, dated Sep. 25, 2017, 16 pages.

*Primary Examiner* — Michael T Tran
(74) *Attorney, Agent, or Firm* — Schwabe, Williamson & Wyatt, P.C.

(57) ABSTRACT

A memory device includes a first plurality of memory cells, a second plurality of memory cells, and a local sense amplifier between the first plurality of memory cells and the second plurality of memory cells, all on a first level, and a local bit line on a second level. The second level is vertically separated by one or more first inter-level dielectric layers from the first level in a first direction and the local bit line is electrically coupled to each memory cell of the first plurality of memory cells and the second plurality of memory cells, as well as the local sense amplifier. The memory device also includes a global bit line on a third level vertically separated by one or more inter-level dielectric layers from the first level in a second direction opposite the first direction, with the global bit line electrically coupled to the local sense amplifier.

17 Claims, 9 Drawing Sheets

(51) Int. Cl.
*G11C 11/419* (2006.01)
*H01L 21/311* (2006.01)
*H01L 21/768* (2006.01)
*H01L 23/528* (2006.01)
*H01L 23/522* (2006.01)
*G11C 11/417* (2006.01)
*G11C 7/18* (2006.01)

(52) U.S. Cl.
CPC ....... *G11C 11/419* (2013.01); *H01L 21/31111* (2013.01); *H01L 21/76802* (2013.01); *H01L 21/76877* (2013.01); *H01L 23/522* (2013.01); *H01L 23/528* (2013.01); *H01L 27/1116* (2013.01); *G11C 7/18* (2013.01); *G11C 2207/002* (2013.01); *G11C 2207/005* (2013.01)

(58) Field of Classification Search
CPC ........... G11C 2207/002; H01L 27/1104; H01L 23/522; H01L 21/31111; H01L 21/76802; H01L 21/76877; H01L 23/528; H01L 27/1116
USPC .................................................. 365/72, 205
See application file for complete search history.

(56) References Cited

U.S. PATENT DOCUMENTS

| | | | |
|---|---|---|---|
| 8,351,236 B2* | 1/2013 | Yan | B82Y 10/00 365/130 |
| 8,471,362 B2* | 6/2013 | Lee | G11C 5/025 257/532 |
| 9,177,619 B2* | 11/2015 | Kajigaya | G11C 7/065 |
| 9,236,097 B2* | 1/2016 | Sugamoto | G11C 7/08 |
| 9,432,298 B1* | 8/2016 | Smith | H04L 49/9057 |
| 9,589,604 B1* | 3/2017 | Fritsch | G11C 29/026 |
| 10,176,868 B2* | 1/2019 | Kitagawa | G11C 13/0069 |
| 2001/0002882 A1* | 6/2001 | Shimazaki | G11C 11/419 365/51 |
| 2002/0071302 A1 | 6/2002 | Kawasumi | |
| 2003/0179644 A1* | 9/2003 | Anvar | G11C 29/808 365/233.1 |
| 2003/0202406 A1 | 10/2003 | Issa | |
| 2005/0213419 A1* | 9/2005 | Miyamoto | G11C 14/0072 365/230.03 |
| 2006/0034141 A1* | 2/2006 | Iioka | G11C 16/06 365/230.03 |
| 2006/0291266 A1* | 12/2006 | Zhang | G11C 16/0491 365/100 |
| 2007/0263423 A1 | 11/2007 | Scheuerlein et al. | |
| 2008/0112251 A1* | 5/2008 | Youn | G11C 5/063 365/230.03 |
| 2008/0278923 A1* | 11/2008 | Losavio | H01L 25/0657 361/803 |
| 2008/0291764 A1* | 11/2008 | Kajigaya | G11C 11/4097 365/205 |
| 2009/0291522 A1 | 11/2009 | Oh et al. | |
| 2010/0260002 A1* | 10/2010 | Chen | G11C 11/413 365/207 |
| 2010/0265778 A1* | 10/2010 | Yasuda | G11C 8/08 365/194 |
| 2011/0122687 A1* | 5/2011 | Kwon | G11C 11/4091 365/185.02 |
| 2011/0134678 A1* | 6/2011 | Sato | H01L 27/10885 365/63 |
| 2011/0199840 A1* | 8/2011 | Kajigaya | G11C 11/4096 365/189.15 |
| 2011/0309475 A1* | 12/2011 | Lee | G11C 5/025 257/532 |
| 2012/0314468 A1 | 12/2012 | Siau et al. | |
| 2013/0043455 A1* | 2/2013 | Bateman | H01L 27/2454 257/5 |
| 2013/0148415 A1* | 6/2013 | Shu | H01L 27/1104 365/154 |
| 2013/0194857 A1* | 8/2013 | Miyamoto | G11C 11/4063 365/149 |
| 2013/0215698 A1* | 8/2013 | Nagata | G11C 11/4091 365/203 |
| 2013/0294136 A1* | 11/2013 | Siau | G11C 7/00 365/66 |
| 2014/0140124 A1* | 5/2014 | Kang | G11C 11/1673 365/148 |
| 2014/0286075 A1* | 9/2014 | Katayama | G11C 11/1659 365/66 |
| 2015/0063039 A1* | 3/2015 | Chen | G11C 29/808 365/189.02 |
| 2015/0121052 A1* | 4/2015 | Emma | G06F 11/348 713/1 |
| 2015/0243356 A1* | 8/2015 | Conte | G11C 8/04 365/163 |
| 2015/0262626 A1* | 9/2015 | Hatsuda | G11C 11/1653 365/72 |
| 2015/0277770 A1* | 10/2015 | Tsai | G11C 5/025 711/104 |
| 2016/0078919 A1* | 3/2016 | Han | G11C 5/02 365/207 |
| 2016/0141337 A1* | 5/2016 | Shimabukuro | H01L 27/2436 365/51 |
| 2016/0155722 A1* | 6/2016 | Leedy | H01L 25/16 257/686 |
| 2016/0276023 A1* | 9/2016 | Chen | G11C 11/1675 |
| 2017/0062067 A1* | 3/2017 | Yang | G11C 16/10 |
| 2017/0076802 A1* | 3/2017 | Mokhlesi | G11C 16/10 |
| 2017/0084328 A1* | 3/2017 | Hsu | G11C 16/3459 |
| 2017/0177526 A1* | 6/2017 | Wu | G11C 7/1048 |
| 2017/0206949 A1* | 7/2017 | Pickering | G11C 7/12 |
| 2017/0365209 A1* | 12/2017 | Kurokawa | G06F 3/0416 |
| 2019/0103155 A1* | 4/2019 | Cosemans | G11C 7/062 |
| 2019/0146703 A1* | 5/2019 | Kim | G06F 3/0673 714/764 |
| 2019/0147944 A1* | 5/2019 | Pulluru | G11C 7/18 365/203 |
| 2020/0279606 A1* | 9/2020 | Tomita | G11C 13/0028 |
| 2020/0365207 A1* | 11/2020 | Huang | G11C 15/04 |
| 2020/0388328 A1* | 12/2020 | Jung | G11C 11/418 |
| 2021/0082494 A1* | 3/2021 | Liaw | G11C 11/419 |
| 2021/0090639 A1* | 3/2021 | Siddiqui | G11C 11/412 |
| 2021/0091098 A1* | 3/2021 | Tsukamoto | G11C 11/412 |
| 2021/0098035 A1* | 4/2021 | Tsai | G11C 7/12 |
| 2021/0098049 A1* | 4/2021 | Yang | H01L 29/785 |
| 2021/0098052 A1* | 4/2021 | Katoch | G11C 11/412 |
| 2021/0098055 A1* | 4/2021 | Lim | G11C 11/419 |
| 2021/0098058 A1* | 4/2021 | Yang | G11C 11/419 |
| 2021/0133549 A1* | 5/2021 | Wang | G06N 3/0635 |
| 2021/0143065 A1* | 5/2021 | Gardner | H01L 21/823807 |
| 2021/0143142 A1* | 5/2021 | Fujisawa | H01L 25/18 |

\* cited by examiner

SRAM WITH HIERARCHICAL BIT LINES IN MONOLITHIC 3D INTEGRATED CHIPS

RELATED APPLICATION(S)

This application is a national stage filing under 35 U.S.C. § 371 of International Patent Application No. PCT/US2016/069188, filed Dec. 29, 2016, which is hereby incorporated by reference herein in its entirety.

TECHNICAL FIELD

This disclosure relates to monolithic three-dimensional (3D) integrated chips, and more particularly to 3D integrated chips with a static random access memory (SRAM) with hierarchical bit lines.

BACKGROUND

Semiconductor integrated chips can be fabricated in a process that includes imaging, deposition and etching. Additional steps can include doping and cleaning. Wafers (such as mono-crystal silicon wafers, silicon on sapphire wafers or gallium arsenide wafers) can be used as a substrate. Photolithography can be used to mark areas of the wafer for enhancement through doping or deposition. An integrated circuit is composed of a plurality of layers which can include diffusion layers (which can include dopants), implant layers (which can include additional ions), metal layers (defining conduction) and/or via or contact layers (which can define conduction between layers).

DETAILED DESCRIPTION OF PREFERRED EMBODIMENTS

Figure 1:
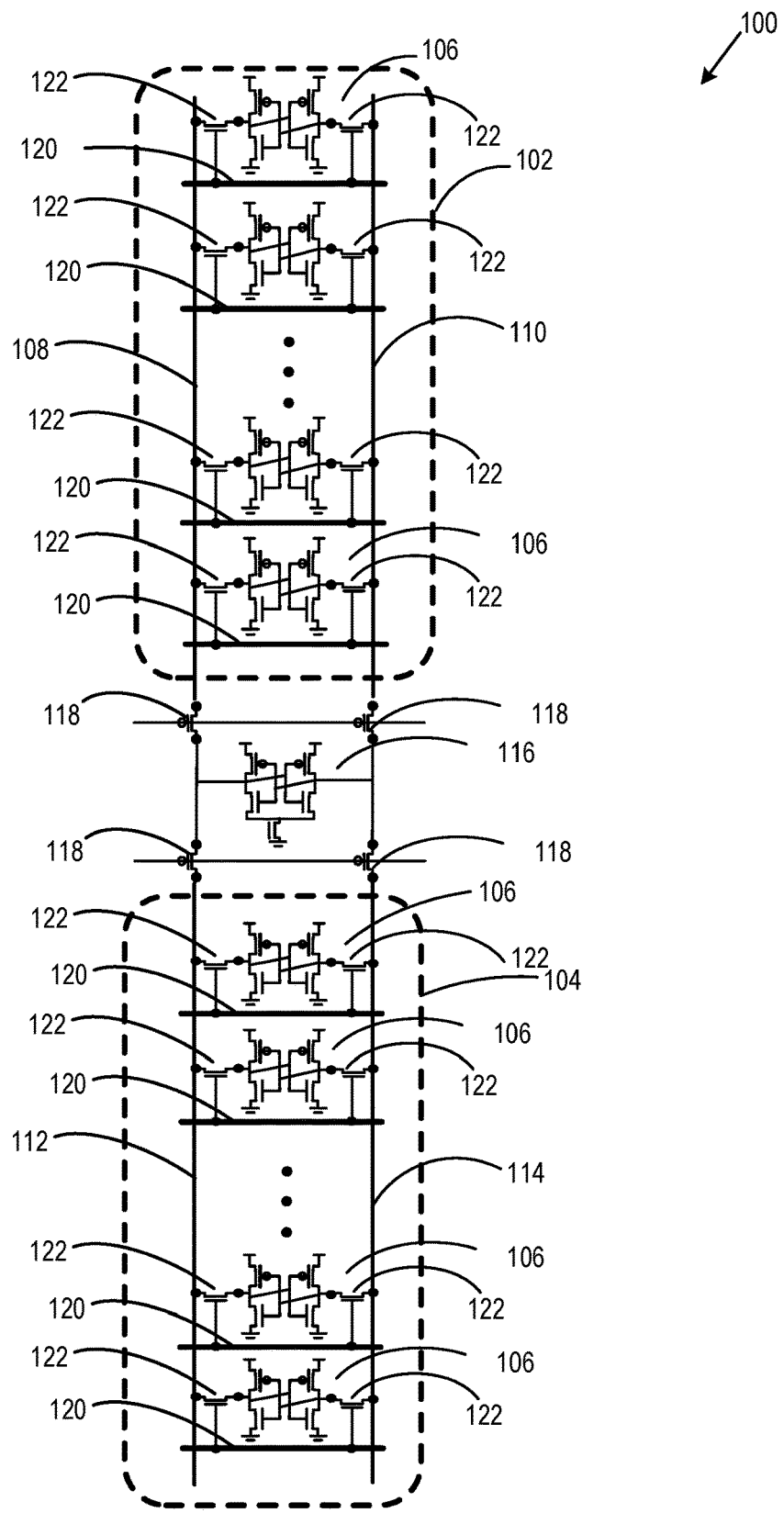
FIG. 1 is a schematic of a conventional SRAM array.

Interconnect scaling in advanced semiconductor device fabrication has significantly reduced the dimensions of metal lines and caused rapid increase of metal resistance. This is problematic to SRAM device design where long metal lines are used in a memory array for bit lines and word lines. As an example, the resistance of bit line in a typical SRAM memory array increases from less than $100\Omega$ in a 22 nm semiconductor device fabrication node to more than $1000\Omega$ in a 7 nm semiconductor device fabrication node. Higher bit line resistance significantly affects SRAM device performance as a large resistive-capacitive (RC) delay, contributed by the resistive bit line, increases the time to read and write data from an SRAM memory array. To mitigate the performance impact by high metal resistance, memory design in advanced semiconductor device fabrication limits the size of the memory array to maintain adequate bit line resistance. This practice, however, reduces the benefit of using scaled technology for higher memory density.

Described herein are systems and methods of an SRAM memory device with hierarchical bit lines. In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the embodiments. However, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of embodiments of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternative materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the embodiments.

A plurality of transistors, such as metal-oxide-semiconductor field-effect transistors (MOSFET or simply MOS transistors), may be fabricated on the substrate. In various implementations of the embodiments, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may include at least one P-type workfunction metal or N-type workfunction metal, depending on whether the transistor is to be a PMOS or an NMOS transistor. In some implementations, the gate electrode layer may include a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may include a U-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the embodiments, the gate electrode may include a combination of U-shaped structures and planar, non-U-shaped structures. For example, the gate electrode may include one or more U-shaped metal layers formed atop one or more planar, non-U-shaped layers.

In some implementations of the embodiments, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance; two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternative semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 illustrates a schematic of a conventional SRAM array 100. The SRAM array 100 may include a plurality of memory cell groups 102 and 104. Each memory cell group 102, 104 includes a plurality of memory cells 106. The memory cell group 102 is connected to a single pair of bit lines 108, 110. The memory cell group 104 is also connected to a single pair of bit lines 112, 114. The pairs of bit lines 108-114 electrically couple the memory cell groups 102, 104 through a sense amplifier 116 via column selector transistors 118. Each wordline 120 connects to a gate of a transistor 122, as well as each bit line 108, 110 in the memory cell group 102 or each bit line 112, 114 in the memory cell group 104. Each wordline 120 in the memory cell group 102 enables access to the respective memory cell 106 and controls to which bit line 108, 110 the respective memory cell 106 connects. Each wordline 120 in the memory cell group 104 enables access to the memory cell 106 and controls to which bit line 112, 114 the respective memory cell 106 connects. Wordlines 120 are used to transfer data for both read and write operations.

Figure 2:
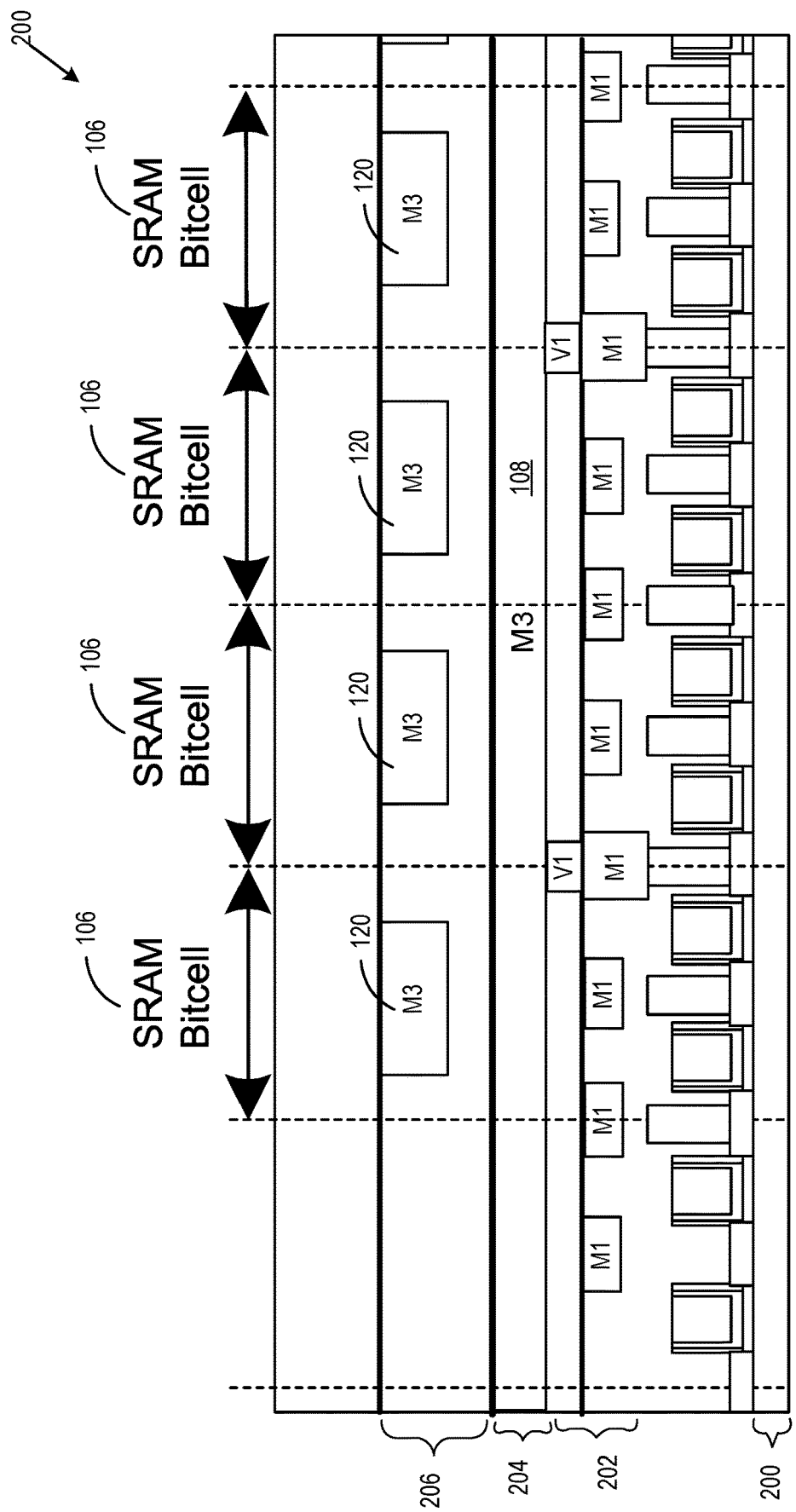
FIG. 2 is a cross-section view of a block diagram of interconnects in a conventional SRAM array.

FIG. 2 illustrates a cross-sectional block diagram of interconnects in a conventional SRAM array. As illustrated in FIG. 2, the memory cells 106 are located on a layer 202 above a substrate 200. The bit line 108 is on a second metal layer 204 and connects to transistors of the memory cells 106 through an inter-layer interconnect. The second metal layer 204 in the conventional SRAM array is shared by many wires of the SRAM device, including bit lines, power supply, and short wires connecting wordlines 120 on a third metal layer 206 to a gate of a transistor in the memory cell 106.

Figure 3:
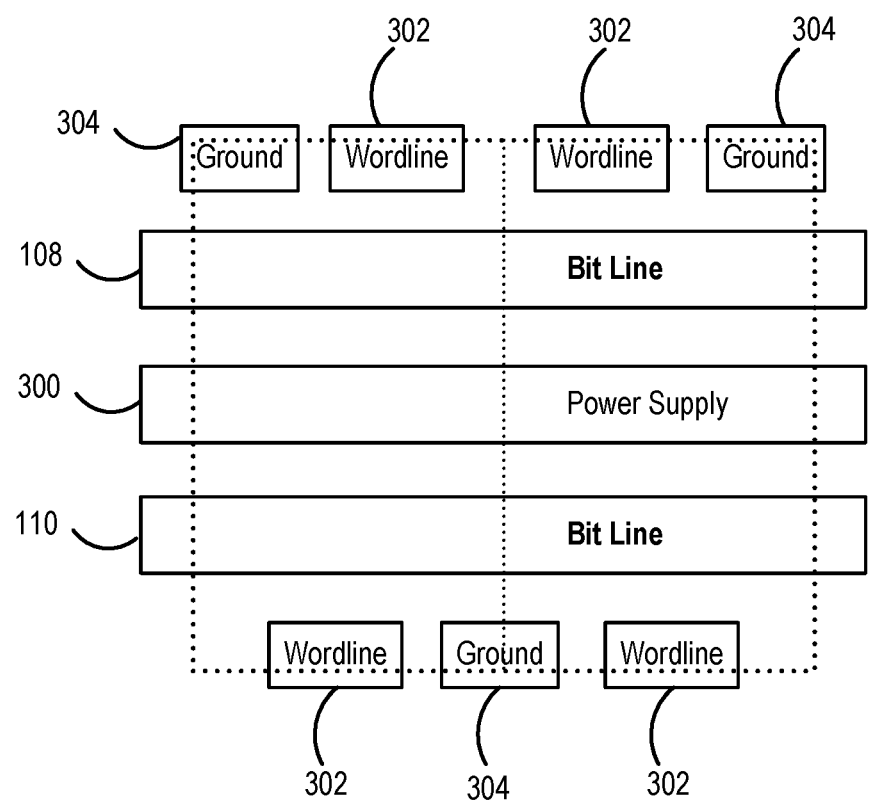
FIG. 3 is a top-down view of a portion of a metal layer of a conventional SRAM.

FIG. 3 illustrates a top-down schematic of a bit line layout on the second metal layer 204. As mentioned above, the second metal layer 204 includes the bit lines 108, 110, a power supply 300, and short wires 302 connecting the word lines 120 on the third metal layer 206. The second metal layer 204 also includes short wires 304 to connect to ground.

By adding more of the memory cells 106 to each of the memory cell groups 102, 104 and connecting the memory cells 106 to the same bit line 108, 110, which also shares the same sense amplifier 116, density of memory arrays can be improved due to a smaller area overhead of a column circuit. Adding more of the memory cells 106 to each of the memory cell groups 102, 104, however, increases the length and resistance of each bit line 108-114, which results in an increase of time to read and write to the memory cells 106. Further, with limited memory cell area, the bit lines 108-114 typically need to use metal with minimum width, which exacerbates the performance challenges with interconnect dimensional scaling.

Embodiments of the disclosure utilize metal-on-back technology to mitigate the impact of increasing metal line resistance on SRAM device performance as process technology scales. Rather than providing a long bit line, as is conventional, embodiments of the disclosure include a short local bit line and a long global bit line. With metal-on-back technology, the short local bit line uses interconnects on the backside of a semiconductor wafer, while the long global bit line uses interconnects on a frontside of the semiconductor wafer.

The short local bit line may be optimized for low capacitance to reduce noise disturbance on a storage node of a memory cell during read operations. The long global bit line is optimized for low resistance to reduce delay of read and write operations. With proper optimization of local and global bit line resistance, as discussed in more detail below, the hierarchical bit lines can deliver faster SRAM access speed and improve a read margin with the same number of metal layers as a conventional SRAM design.

Figure 4:
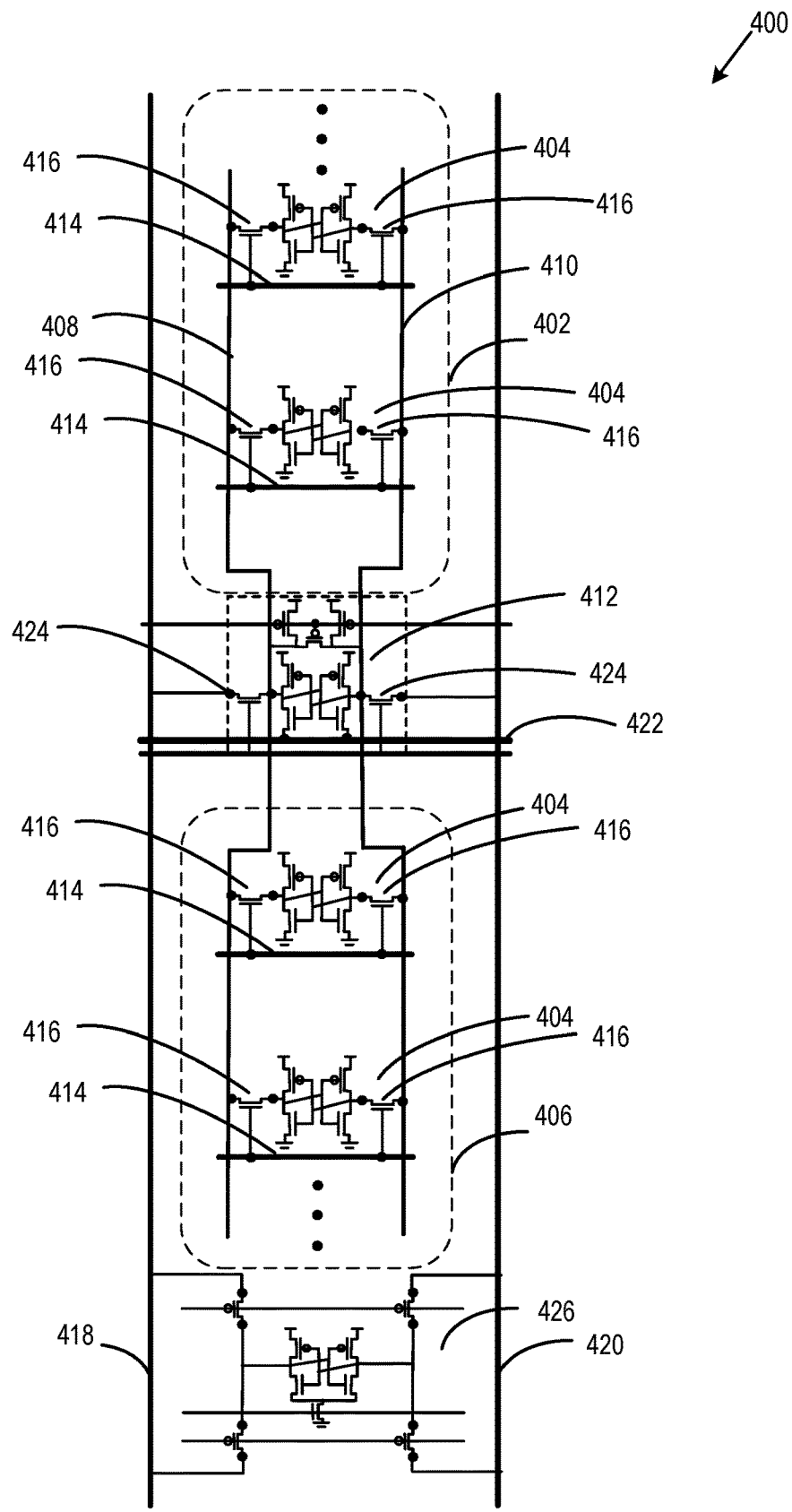
FIG. 4 is a schematic of an SRAM array according to embodiments of the disclosure.

FIG. 4 illustrates a schematic of a partial SRAM array 400 according to one embodiment of the disclosure. The SRAM array 400 includes a first group 402 of memory cells 404 and a second group 406 of the memory cells 404, and each memory cell 404 of each group 402, 406 is electrically coupled to a pair of local bit lines 408, 410. Each group 402, 406 of the memory cells 404 is electrically coupled to a local sense amplifier 412. A local word line 414 electrically couples to each memory cell and the local bit lines 408, 410. Each local word line 414 electrically couples to a gate of each access transistor 416 of each memory cell 404. Although two memory cells 404 are shown in each of the first group 402 and the second group 406, each group 402, 406 may include a plurality of the memory cells 404. For example, each group 402, 406 may include up to 128 memory cells 404.

The local sense amplifier 412 also electrically couples to a pair of global bit lines 418, 420. A global word line 422 electrically couples to a gate of each of a plurality of selector transistors 424 of the local sense amplifier 412 as well as the global bit lines 418, 420. The global bit lines 418, 420 also electrically couple to a global sense amplifier 426.

Although only two groups 402, 406 of the memory cells 404 are shown, a plurality of groups of the memory cells 404 may be provided for each pair of local bit lines 408, 410. The local sense amplifier 412 is provided to electrically couple each group of the memory cells 404. This forms a local bit line group of the memory cells 404. The SRAM array 400 may include a plurality of the global sense amplifiers 426 and a plurality of local bit line groups of the memory cells 404. Each global sense amplifier 426 is disposed between each local bit line group and electrically connects to the global bit lines 418, 420.

Figure 5:
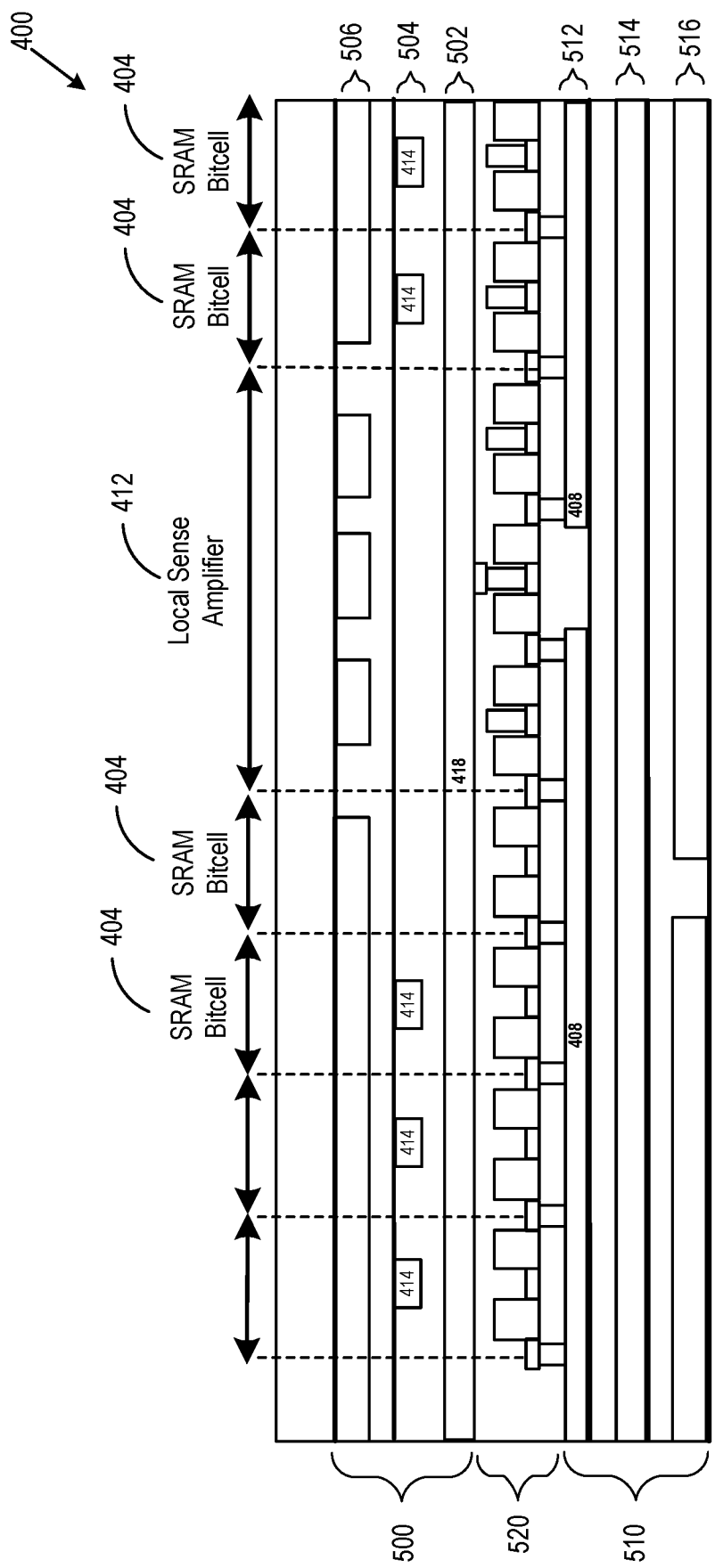
FIG. 5 is a cross-section view of a block diagram of interconnects in an SRAM array according to embodiments of the disclosure.

FIG. 5 illustrates a cross-sectional view of a block diagram of the partial SRAM array 400 according to some embodiments of the disclosure. The partial SRAM array 400 includes a frontside interconnect 500 and a backside interconnect 510.

The global bit line 418 is provided on a first upper metal layer 502 in the frontside interconnect 500 above a memory cell layer 520. The local bit lines 408, 410 are included in the backside interconnect 510 on a first lower metal layer 512 below the memory cell layer 520. The first lower metal layer 512 is dedicated to the local bit lines 408, 410. This allows for much larger line-to-line spacing to minimize line-to-line coupling capacitance. For example, the local bit lines 408, 410 may be 50 nm apart. Further, resistance of the local bit lines 408, 410 is maintained at a low level by using reasonably wide metal lines. For example, each bit line 408, 410 may be approximately 50 nm wide. Low local bit line resistance and capacitance reduces bit line signal development time and helps minimize disturbances on a storage node during a read operation.

In addition to the global bit line 418, the first upper metal layer 502 includes a power supply and short wire interconnects for the local word lines 414 provided on a second upper metal layer 504. Larger selector transistors 424 in the local sense amplifier 412 provides a higher current to drive the global bit lines 418, 420 so a reasonable write and read time can be achieved. A third upper metal layer 506, a second lower layer 514 and a third lower layer 516 may be used for signals unrelated to the SRAM memory device. One or more inter-level dielectric layers may be disposed between each of the layers 502, 504, 506, 512, 514, and 516. Further, inter-layer interconnects may be used to connect various components located on different layers.

Figure 6B:
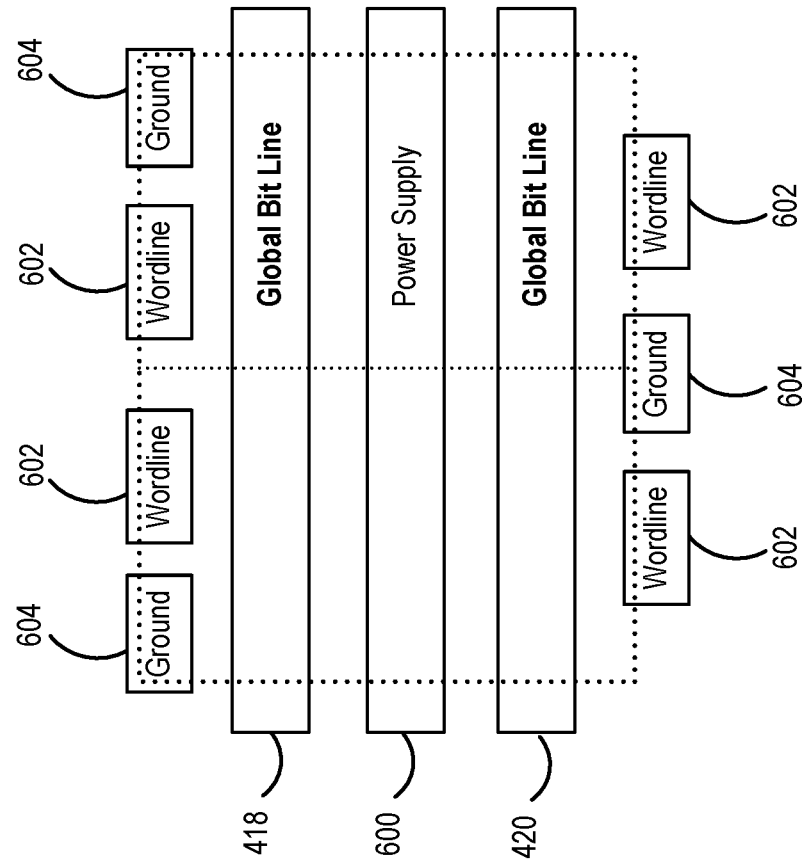
FIG. 6B is a top-down view of a portion of another metal layer of an SRAM array according to one or more embodiments of the disclosure.
Figure 6A:
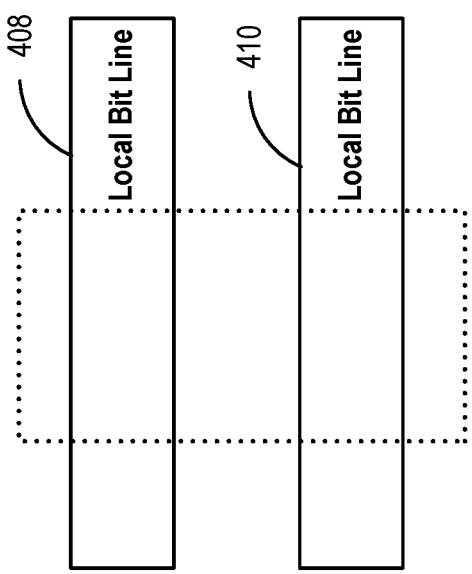
FIG. 6A is a top-down view of a portion of a metal layer of an SRAM array according to one or more embodiments of the disclosure.

FIG. 6A illustrates a top-down schematic of the first lower metal layer 512. FIG. 6B illustrates a top-down schematic of the first upper metal layer 502. As discussed above, the first lower metal layer 512 only includes the local bit lines 408, 410. The first upper metal layer 502 includes the global bit lines 418, 420, as well as a power supply 600 and short wire connections 602 for the word lines 414 on the second upper metal layer 504 and short wire connections 604 for ground.

Figure 7:
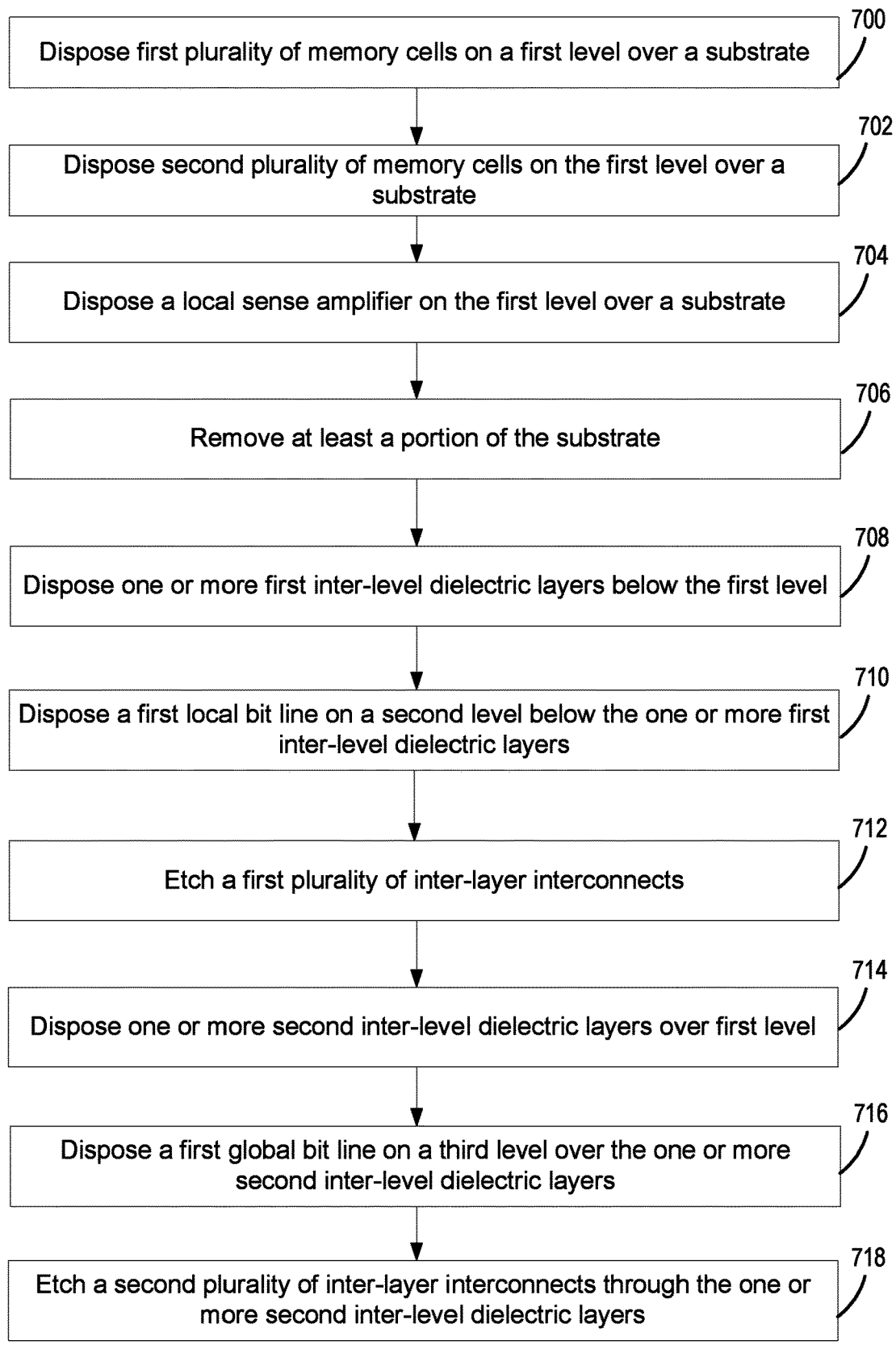
FIG. 7 is a flow chart for fabricating a memory device according to one or more embodiments of the disclosure.

FIG. 7 illustrates a process for fabricating a memory device according to embodiments of the disclosure. To fabricate the memory device with hierarchical bit lines, a first plurality of memory cells are disposed 700 on a first level over a substrate and extend laterally. A second plurality of memory cells extending laterally are also disposed 702 on the first level. A local sense amplifier is also disposed 704 on the first level. At least a portion of the substrate is removed 706 using a backside reveal process. One or more first inter-level dielectric layers are then disposed 708 below the first level after the portion of the substrate has been removed. A first local bit line extending laterally is disposed 710 on a second level below the one or more first inter-level dielectric layers. A first plurality of inter-layer interconnects may be etched 712 through the one or more inter-level dielectric layers between the first level and the second level to electrically couple the local bit line to each memory cell of the first plurality of memory cells, each memory cell of the second plurality of memory cells, and the local sense amplifier. One or more second inter-level dielectric layers are disposed 714 over the first level. A first global bit line extending laterally on a third level is disposed 716 over the one or more second inter-level dielectric layers. A second plurality of inter-layer interconnects are etched 718 through the one or more second inter-level dielectric layers between the first level and the third level to electrically couple the global bit line to the local sense amplifier.

A second local bit line may also be disposed on the second level. The first plurality of inter-layer interconnects includes inter-layer interconnects to electrically couple the second local bit line to each memory cell of the first plurality of memory cells, each memory cell of the second plurality of memory cells, and the local sense amplifier. A second global bit line is disposed on the third level. The second plurality of inter-layer interconnects also includes an inter-layer interconnect to electrically couple the second global bit line to the local sense amplifier.

One or more third inter-level dielectric layers may also be disposed over the second level. A first plurality of wordlines extending laterally are disposed on a fourth level over the one or more third inter-level dielectric layers. A second plurality of wordlines extending laterally are also disposed on the fourth level. A third plurality of inter-layer interconnects are etched through the one or more third inter-level dielectric layers and the one or more second inter-level dielectric layers. The third plurality of inter-layer interconnects include inter-layer interconnects to electrically couple each wordline of the first plurality of wordlines to a memory cell of the first plurality of memory cells and inter-layer interconnects to electrically couple each wordline of the second plurality of wordlines to a memory cell of the second plurality of memory cells. A fourth plurality of inter-layer interconnects are etched through the one or more third inter-level dielectric layers, the one or more second inter-level dielectric layers, and the one or more first inter-level dielectric layers. The fourth plurality of inter-layer interconnects electrically couple each wordline to a respective memory cell of the first plurality of memory cells or the second plurality of memory cells.

The backside reveal process, as well as disposing the first local bit line below the first level, may be performed after disposing the third and fourth levels.

Figure 8:
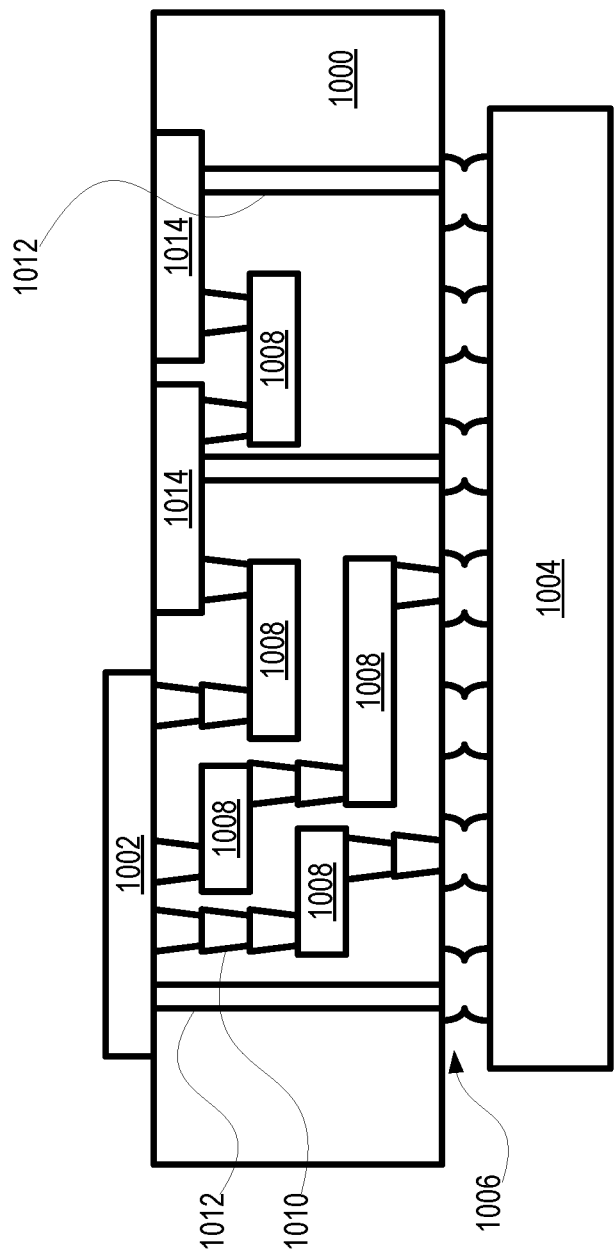
FIG. 8 illustrates an interposer implementing one or more embodiments of the disclosure.

FIG. 8 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of the interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002, 1004 are attached to opposing sides of the interposer 1000. In other embodiments, the first and second substrates 1002, 1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternative rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the disclosure, apparatuses or processes disclosed herein may be used in the fabrication of the interposer 1000.

Figure 9:
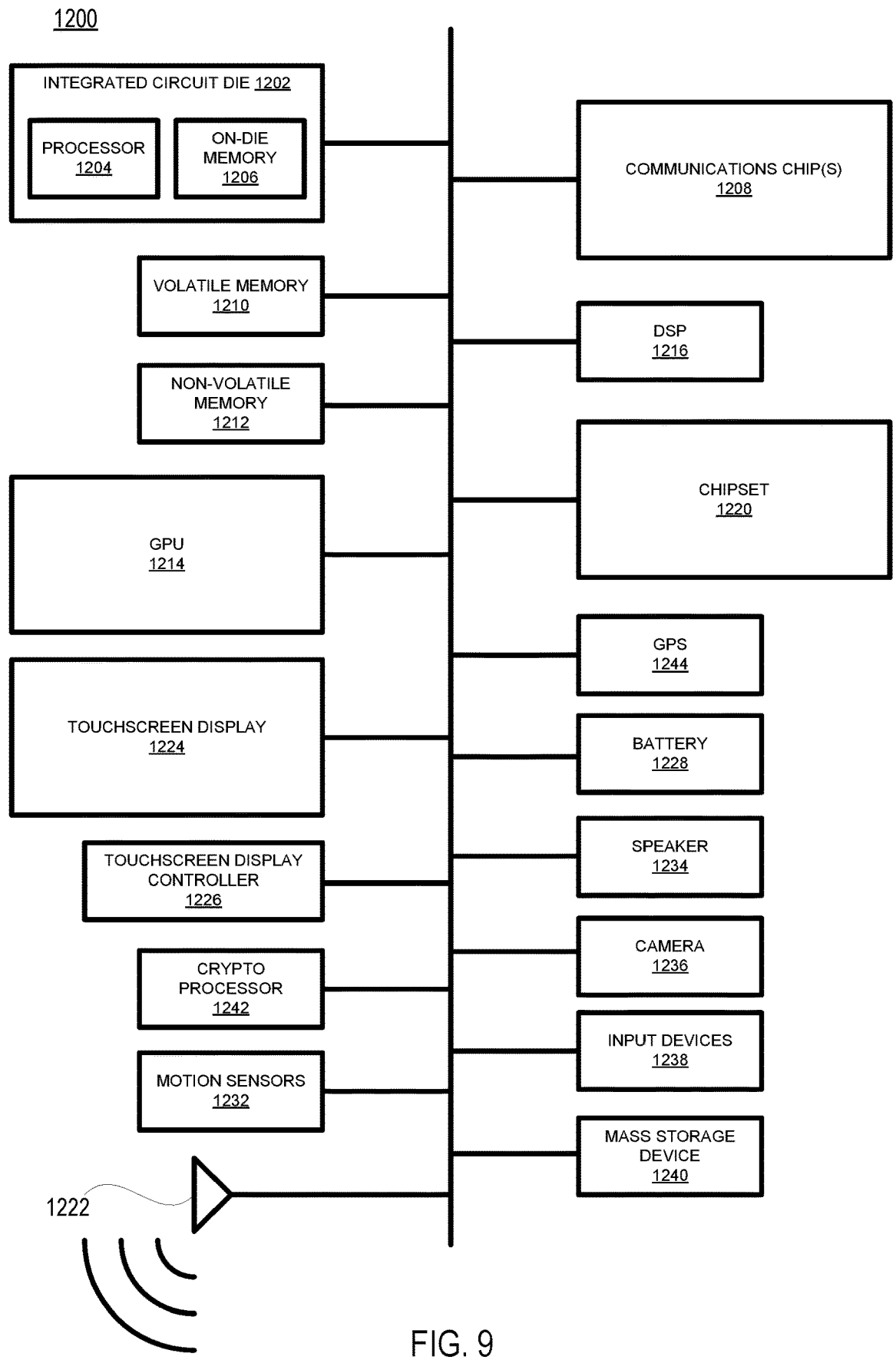
FIG. 9 illustrates a computing device built in accordance with an embodiment of the disclosure.

FIG. 9 illustrates a computing device 1200 in accordance with one embodiment of the disclosure. The computing device 1200 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1200 include, but are not limited to, an integrated circuit die 1202 and at least one communications chip 1208. In some implementations the communications logic unit 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a processor 1204 as well as on-die memory 1206, often used as cache memory, that can be provided by technologies such as embedded DRAM (eDRAM), SRAM, or spin-transfer torque memory (STT-MRAM).

The computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit (GPU) 1214, a digital signal processor (DSP) 1216, a crypto processor 1242 (e.g., a specialized processor that executes cryptographic algorithms within hardware), a chipset 1220, at least one antenna 1222 (in some implementations two or more antenna may be used), a display or a touchscreen display 1224, a touchscreen controller 1226, a battery 1228 or other power source, a power amplifier (not shown), a voltage regulator (not shown), a global positioning system (GPS) device 1244, a compass 1230, a motion coprocessor or sensors 1232 (that may include an accelerometer, a gyroscope, and a compass), a microphone (not shown), a speaker 1234, a camera 1236, user input devices 1238 (such as a keyboard, mouse, stylus, and touchpad), and a mass storage device 1240 (such as a hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver) that is used to communicate over a distance by modulating and radiating electromagnetic waves in air or space.

The communications logic unit 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3 G, 4 G, 5 G, and beyond. The computing device 1200 may include a plurality of communications logic units 1208. For instance, a first communications logic unit 1208 may be dedicated to shorter range wireless communications such as Wi-Fi, NFC, and Bluetooth, and a second communications logic unit 1208 may be dedicated to longer range wireless communications such as GPS, EDGE, GPRS, CDMA, WiMAX, LTE, Ev-DO, and others.

The processor 1204 of the computing device 1200 includes one or more devices, such as an SRAM with hierarchical bit lines, that are formed in accordance with embodiments of the disclosure. The term "processor" may refer to any device or portion of a device that processes electronic data from registers and/or memory to transform that electronic data into other electronic data that may be stored in registers and/or memory.

The communications logic unit 1208 may also include one or more devices, such as an SRAM with hierarchical bit lines, that are formed in accordance with embodiments of the disclosure.

In further embodiments, another component housed within the computing device 1200 may contain one or more devices, such as an SRAM with hierarchical bit lines, that are formed in accordance with implementations of the embodiments of the disclosure.

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLE EMBODIMENTS

The following are examples of further embodiments. Examples may include subject matter such as a battery, device, method, means for performing acts of the method, or of at least one machine-readable medium including instructions that, when performed by a machine cause the machine to perform acts of the method according to the embodiments and examples described herein.

Example 1 is a memory device. The memory device includes a first variety of memory cells extending laterally on a first level, a second variety of memory cells extending laterally on the first level, and a local sense amplifier on the first level between the first variety of memory cells and the second variety of memory cells. The memory device also includes a local bit line extending laterally on a second level, the second level vertically separated by one or more first inter-level dielectric layers from the first level in a first direction, the local bit line electrically attached to each memory cell of the first variety of memory cells, each memory cell of the second variety of memory cells, and the local sense amplifier. The memory device also includes a global bit line extending laterally on a third level vertically separated by one or more second inter-level dielectric layers from the first level in a second direction opposite the first direction, the global bit line electrically attached to the local sense amplifier.

Example 2 is the memory device of Example 1, further including a variety of local sense amplifiers, a variety of local bit lines, and a global sense amplifier on the first level electrically attached to the global bit line.

Example 3 is the memory device of Example 1, further including a first variety of inter-layer interconnects through the one or more first inter-level dielectric layers to electrically attach the local bit line to each memory cell of the first variety of memory cells, each memory cell of the second variety of memory cells, and the local sense amplifier.

Example 4 is the memory device of Example 3, further including a second variety of inter-layer interconnects through the one or more second inter-level dielectric layers to electrically attach the global bit line to the local sense amplifier.

Example 5 is the memory device of Example 1, where a power supply extends laterally along the third level.

Example 6 is the memory device of Example 1, where the local bit line is wider than the global bit line.

Example 7 is the memory device of any one of Examples 1-6, where the local bit line is a first local bit line and the global bit line is a first global bit line, the memory device further includes a second local bit line extending laterally on the second level, the second local bit line electrically attached to each memory cell of the first variety of memory cells, each memory cell of the second variety of memory cells, and the local sense amplifier, and a second global bit line extending laterally on the third level, the second global bit line electrically attached to the local sense amplifier.

Example 8 is the memory device of Example 7, further includes a first variety of wordlines extending laterally on a fourth level vertically separated by one or more third inter-level dielectric layers from the third level in the second direction, each wordline of the first variety of wordlines electrically attached to the first local bit line, the second local bit line, and a memory cell of the first variety of memory cells, and a second variety of wordlines extending laterally on the fourth level, each wordline of the second variety of wordlines electrically attached to the first local bit line, the second local bit line, and a memory cell of the second variety of memory cells.

Example 9 is the memory device of Example 8, further includes a third variety of inter-layer interconnects through the one or more first inter-level dielectric layers, the one or more second inter-level dielectric layers, and the one or more third inter-level dielectric layers to electrically attach each wordline to the local sense amplifier, and a fourth variety of inter-layer interconnects through the one or more second inter-level dielectric layers and the one or more third inter-level dielectric layers to electrically attach each wordline to one memory cell of either the first variety of memory cells or the second variety of memory cells.

Example 10 is the memory device of Example 9, where the memory device is a static random access memory cell.

Example 11 is a method of fabricating a memory device including disposing a first variety of memory cells extending laterally on a first level on a substrate, disposing a second variety of memory cells extending laterally on the first level on the substrate, and disposing a local sense amplifier on the first level on the substrate. The method also includes removing at least a portion of the substrate, disposing one or more first inter-level dielectric layers below the first level, and disposing a local bit line extending laterally on a second level below the one or more first inter-level dielectric layers. The method also includes etching a first variety of inter-layer interconnects through the one or more inter-level dielectric layers between the first level and the second level to electrically attach the local bit line to each memory cell of the first variety of memory cells each memory cell of the second variety of memory cells, and the local sense amplifier, disposing one or more second inter-level dielectric layers over the first level, and disposing a global bit line extending laterally on a third level over the one or more second inter-level dielectric layers. The method also includes etching a second variety of inter-layer interconnects through the one or more second inter-level dielectric layers between the first level and the third level to electrically attach the global bit line to the local sense amplifier.

Example 12 is the method of Example 11, further includes disposing a global sense amplifier on the first level, where the second variety of inter-layer interconnects includes an inter-layer interconnect to electrically attach the global sense amplifier to the global bit line.

Example 13 is the method of Example 11, further includes disposing a power supply on the third level.

Example 14 is the method of Example 11, where the local bit line is wider than the global bit line.

Example 15 is the method according to any one of Examples 11-14, where the local bit line is a first local bit line and the global bit line is a first global bit line, the method further includes disposing a second local bit line on the second level, where the first variety of inter-layer interconnects includes inter-layer interconnects to electrically attach the second local bit line to each memory cell of the first variety of memory cells, each memory cell of the second variety of memory cells, and the local sense amplifier. The method also includes disposing a second global bit line on the third level, where the second variety of inter-layer interconnects includes an inter-layer interconnect to electrically attach the second global bit line to the local sense amplifier.

Example 16 is the method of Example 15, further includes disposing one or more third inter-level dielectric layers over the second level, disposing a first variety of wordlines extending laterally on a fourth level over the one or more third inter-level dielectric layers, and disposing a second variety of wordlines extending laterally on the fourth level. The method also includes etching a third variety of inter-layer interconnects through the one or more third inter-level dielectric layers and the one or more second inter-level dielectric layers, the third variety of inter-layer interconnects including inter-layer interconnects to electrically attach each wordline of the first variety of wordlines to a memory cell of the first variety of memory cells and including inter-layer interconnects to electrically attach each wordline of the second variety of wordlines to a memory cell of the second variety of memory cells. The method also includes etching a fourth variety of inter-layer interconnects through the one or more third inter-level dielectric layers, the one or more second inter-level dielectric layers, and the one or more first inter-level dielectric layers, the fourth variety of inter-layer interconnects electrically coupling each wordline to a respective memory cell of the first variety of memory cells or the second variety of memory cells.

Example 17 is the method of Example 16, where the memory device is a static random access memory cell.

Example 18 is a computing device includes a processor mounted on a substrate, a memory unit capable of storing data, a graphics processing unit, an antenna within the computing device, and a display on the computing device. The computer device also includes a battery within the computing device, a power amplifier within the processor. The computer device also includes a voltage regulator within the processor, where the processor includes a memory device including a first variety of memory cells extending laterally on a first level, a second variety of memory cells extending laterally on the first level, and a local sense amplifier on the first level between the first variety of memory cells and the second variety of memory cells. The computer device also includes a voltage regulator within the processor, where the processor includes a memory device including a local bit line extending laterally on a second level, the second level vertically separated by one or more first inter-level dielectric layers from the first level in a first direction, the local bit line electrically attached to each memory cell of the first variety of memory cells, each memory cell of the second variety of memory cells, and the local sense amplifier, and a global bit line extending laterally on a third level vertically separated by one or more second inter-level dielectric layers from the first level in a second direction opposite the first direction, the global bit line electrically attached to the local sense amplifier.

Example 19 is the memory device of Example 18, further includes a variety of local sense amplifiers, a variety of local bit lines, and a global sense amplifier on the first level electrically attached to the global bit line.

Example 20 is the memory device of Example 18, further includes a first variety of inter-layer interconnects through the one or more first inter-level dielectric layers to electrically attach the local bit line to each memory cell of the first variety of memory cells, each memory cell of the second variety of memory cells, and the local sense amplifier.

Example 21 is the memory device of Example 20, further includes a second variety of inter-layer interconnects through the one or more second inter-level dielectric layers to electrically attach the global bit line to the local sense amplifier.

Example 22 is the memory device of Example 18, where a power supply extends laterally along the third level.

Example 23 is the memory device of Example 18, where the local bit line is wider than the global bit line.

Example 24 is the computing device of Example 18-23, where the local bit line is a first local bit line and the global bit line is a first global bit line, and where the memory device further includes a second local bit line extending laterally on the second level, the second local bit line electrically attached to each memory cell of the first variety of memory cells, each memory cell of the second variety of memory cells, and the local sense amplifier, and a second global bit line extending laterally on the third level, the second global bit line electrically attached to the local sense amplifier.

Example 25 is the computing device of Example 24, the processor further includes a first variety of wordlines extending laterally on a fourth level vertically separated by one or more third inter-level dielectric layers from the third level in the second direction, each wordline of the first variety of wordlines electrically attached to the first local bit line, the second local bit line, and a memory cell of the first variety of memory cells, and a second variety of wordlines extending laterally on the fourth level, each wordline of the second variety of wordlines electrically attached to the first local bit line, the second local bit line, and a memory cell of the second variety of memory cells.

Example 26 is the memory device of Example 25, further includes a third variety of inter-layer interconnects through the one or more first inter-level dielectric layers, the one or more second inter-level dielectric layers, and the one or more third inter-level dielectric layers to electrically attach each wordline to the local sense amplifier, and a fourth variety of inter-layer interconnects through the one or more second inter-level dielectric layers and the one or more third inter-level dielectric layers to electrically attach each wordline to one memory cell of either the first variety of memory cells or the second variety of memory cells.

Example 27 is the memory device of Example 26, where the memory device is a static random access memory cell.

Example 28 is a memory device, including a variety of memory cells, a local sense amplifier, a backside interconnect including a local bit line, the local bit line electrically attached to each memory cell and the local sense amplifier, and a frontside interconnect including a global bit line, the global bit line electrically attached to the local sense amplifier.

Example 29 is the memory device of Example 28, further including a global sense amplifier electrically attached to the global bit line.

Example 30 is the memory device of Example 28, where the local bit line is wider than the global bit line.

Example 31 is the memory device of Example 28, where the local bit line is a first local bit line and the global bit line is a first global bit line, and the backside interconnect includes a second local bit line, and the frontside interconnect includes a second global bit line.

Example 32 is the memory device of Example 31, where the frontside interconnect further includes a variety of word lines, each wordline attached to the first local bitline, the second local bit line, and a memory cell of the variety of memory cells.

The above description of illustrated implementations of the embodiments, including what is described in the Abstract, is not intended to be exhaustive or to limit the disclosure to the precise forms disclosed. While specific implementations of, and examples for, the embodiments are described herein for illustrative purposes, various equivalent modifications are possible within the scope of the disclosure, as those skilled in the relevant art will recognize.

It will be obvious to those having skill in the art that many changes may be made to the details of the above-described embodiments without departing from the underlying principles of the disclosure. The scope of the present disclosure should, therefore, be determined only by the following claims.

The invention claimed is:

1. A memory device, comprising:
   a first plurality of memory cells extending laterally on a first level;
   a second plurality of memory cells extending laterally on the first level;
   a local sense amplifier on the first level between the first plurality of memory cells and the second plurality of memory cells;
   a local bit line extending laterally on a second level, the second level vertically separated by one or more first inter-level dielectric layers from the first level in a first direction, the local bit line electrically coupled to each memory cell of the first plurality of memory cells, each memory cell of the second plurality of memory cells, and the local sense amplifier; and
   a global bit line extending laterally on a third level vertically separated by one or more second inter-level dielectric layers from the first level in a second direction opposite the first direction, the global bit line electrically coupled to the local sense amplifier.

2. The memory device of claim 1, further comprising:
   a plurality of local sense amplifiers;
   a plurality of local bit lines; and
   a global sense amplifier on the first level electrically coupled to the global bit line.

3. The memory device of claim 1, further comprising a first plurality of inter-layer interconnects through the one or more first inter-level dielectric layers to electrically couple the local bit line to each memory cell of the first plurality of memory cells, each memory cell of the second plurality of memory cells, and the local sense amplifier.

4. The memory device of claim 3, further comprising a second plurality of inter-layer interconnects through the one or more second inter-level dielectric layers to electrically couple the global bit line to the local sense amplifier.

5. The memory device of claim 1, wherein a power supply extends laterally along the third level.

6. The memory device of claim 1, wherein the local bit line is wider than the global bit line.

7. The memory device of claim 1, wherein the local bit line is a first local bit line and the global bit line is a first global bit line, the memory device further comprising: a second local bit line extending laterally on the second level, the second local bit line electrically coupled to each memory cell of the first plurality of memory cells, each memory cell of the second plurality of memory cells, and the local sense amplifier; and a second global bit line extending laterally on the third level, the second global bit line electrically coupled to the local sense amplifier.

8. The memory device of claim 7, further comprising:
   a first plurality of wordlines extending laterally on a fourth level vertically separated by one or more third inter-level dielectric layers from the third level in the second direction, each wordline of the first plurality of wordlines electrically coupled to the first local bit line, the second local bit line, and a memory cell of the first plurality of memory cells; and
   a second plurality of wordlines extending laterally on the fourth level, each wordline of the second plurality of wordlines electrically coupled to the first local bit line, the second local bit line, and a memory cell of the second plurality of memory cells.

9. The memory device of claim 8, further comprising:
   a third plurality of inter-layer interconnects through the one or more first inter-level dielectric layers, the one or more second inter-level dielectric layers, and the one or more third inter-level dielectric layers to electrically couple each wordline to the local sense amplifier; and a fourth plurality of inter-layer interconnects through the one or more second inter-level dielectric layers and the one or more third inter-level dielectric layers to electrically couple each wordline to one memory cell of either the first plurality of memory cells or the second plurality of memory cells.

10. The memory device of claim 9, wherein the memory device is a static random access memory cell.

11. A memory device, comprising:
a plurality of memory cells over a substrate, the substrate having a front side opposite a backside;
a local sense amplifier;
a backside interconnect beneath the backside of the substrate, the backside interconnect including a local bit line, the local bit line electrically coupled to each memory cell and the local sense amplifier; and
a frontside interconnect over the front side of the substrate, the frontside interconnect including a global bit line, the global bit line electrically coupled to the local sense amplifier.

12. The memory device of claim 11, further comprising a global sense amplifier electrically coupled to the global bit line.

13. The memory device of claim 11, wherein the local bit line is wider than the global bit line.

14. The memory device of claim 11, wherein the local bit line is a first local bit line and the global bit line is a first global bit line, and the backside interconnect includes a second local bit line, and the frontside interconnect includes a second global bit line.

15. The memory device of claim 14, wherein the frontside interconnect further includes a plurality of word lines, each wordline coupled to the first local bitline, the second local bit line, and a memory cell of the plurality of memory cells.

16. A memory device, comprising:
a plurality of memory cells;
a local sense amplifier;
a backside interconnect including a local bit line, the local bit line electrically coupled to each memory cell and the local sense amplifier; and
a frontside interconnect including a global bit line, the global bit line electrically coupled to the local sense amplifier, wherein the local bit line is wider than the global bit line.

17. A memory device, comprising:
a plurality of memory cells;
a local sense amplifier;
a backside interconnect including a local bit line, the local bit line electrically coupled to each memory cell and the local sense amplifier; and
a frontside interconnect including a global bit line, the global bit line electrically coupled to the local sense amplifier, wherein the local bit line is a first local bit line and the global bit line is a first global bit line, and the backside interconnect includes a second local bit line, and the frontside interconnect includes a second global bit line, wherein the second local bit line is electrically coupled to the local sense amplifier, and wherein the frontside interconnect further includes a plurality of word lines, each wordline coupled to the first local bitline, the second local bit line, and a memory cell of the plurality of memory cells.

* * * * *